(12) United States Patent
Dannoux

(10) Patent No.: US 9,278,877 B2
(45) Date of Patent: Mar. 8, 2016

(54) GLASS TUBES AND METHODS OF MAKING A SUBSTANTIALLY RECTANGULAR GLASS COVER MEMBER

(71) Applicant: Corning Incorporated, Corning, NY (US)

(72) Inventor: Thierry Luc Alain Dannoux, Avon (FR)

(73) Assignee: CORNING INCORPORATED, Corning, NY (US)

( * ) Notice: Subject to any disclaimer, the term of this patent is extended or adjusted under 35 U.S.C. 154(b) by 127 days.

(21) Appl. No.: 14/051,757

(22) Filed: Oct. 11, 2013

(65) Prior Publication Data

US 2014/0102142 A1    Apr. 17, 2014

Related U.S. Application Data

(60) Provisional application No. 61/714,979, filed on Oct. 17, 2012.

(51) Int. Cl.

| C03B 23/07 | (2006.01) |
|---|---|
| C03B 33/09 | (2006.01) |
| C03B 33/06 | (2006.01) |
| H05K 5/03 | (2006.01) |
| C03B 33/085 | (2006.01) |
| C03B 33/095 | (2006.01) |
| C03B 9/193 | (2006.01) |
| C03B 9/32 | (2006.01) |

(52) U.S. Cl.
CPC ............... *C03B 23/07* (2013.01); *C03B 9/193* (2013.01); *C03B 9/32* (2013.01); *C03B 33/06* (2013.01); *C03B 33/0855* (2013.01); *C03B 33/091* (2013.01); *C03B 33/0955* (2013.01); *H05K 5/03* (2013.01); *Y10T 428/15* (2015.01)

(58) Field of Classification Search
None
See application file for complete search history.

(56) References Cited

U.S. PATENT DOCUMENTS

| 1,559,394 A | 10/1925 | Williams |
|---|---|---|
| 1,881,327 A | 10/1932 | Powell |
| 4,046,299 A | 9/1977 | Swartzfager ............... 225/3 |
| 2010/0127420 A1 | 5/2010 | Dannoux |
| 2010/0300152 A1 | 12/2010 | Dannoux |
| 2011/0067450 A1 | 3/2011 | Fredholm et al. |

FOREIGN PATENT DOCUMENTS

| DE | 1221404 | 7/1966 |
|---|---|---|
| WO | 2010002446 | 1/2010 |
| WO | 2010061238 | 6/2010 |
| WO | 2010065349 | 6/2010 |
| WO | 2010065371 | 6/2010 |

*Primary Examiner* — Mark Halpern
(74) *Attorney, Agent, or Firm* — Jason A. Barron

(57) ABSTRACT

Methods of making a substantially rectangular glass cover member includes the step (I) of providing a glass tube including a plurality of substantially rectangular glass segments including respective edges that are integrally attached to one another at attachment locations. The plurality of substantially rectangular glass segments are radially arranged about an axis of the glass tube to define an outer periphery of the glass tube. The method can further include the step (II) of separating the plurality of substantially rectangular glass segments from one another at the attachment locations to provide a plurality of substantially rectangular glass cover members. In still further examples, glass tubes include a plurality of glass segments that each includes a convex surface and a substantially flat surface.

19 Claims, 10 Drawing Sheets

GLASS TUBES AND METHODS OF MAKING A SUBSTANTIALLY RECTANGULAR GLASS COVER MEMBER

CROSS-REFERENCE TO RELATED APPLICATIONS

This application claims the benefit of priority under 35 U.S.C. §119 of U.S. Provisional Application Ser. No. 61/714,979, filed on Oct. 17, 2012, the content of which is relied upon and incorporated herein by reference in its entirety.

TECHNICAL FIELD

The present invention relates generally to glass tubes and method of making a glass cover member and, more particularly, to glass tubes including a plurality of glass segments that each includes a convex surface and a substantially flat surface and methods of making a substantially rectangular glass cover member from a glass tube including a plurality of substantially rectangular glass segments.

BACKGROUND

Conventional methods are known to provide substantially rectangular glass covers for a wide range of hand held devices, such as cell phones or other mobile internet devices. The glass covers can help protect components of a display device and/or other components of the hand held devices.

SUMMARY

The following presents a simplified summary of the disclosure in order to provide a basic understanding of some example aspects described in the detailed description.

In a first aspect of the disclosure, a method of making a substantially rectangular glass cover member comprises the step (I) of providing a glass tube including a plurality of substantially rectangular glass segments including respective edges that are integrally attached to one another at attachment locations. The plurality of substantially rectangular glass segments are radially arranged about an axis of the glass tube to define an outer periphery of the glass tube. The method can further include the step (II) of separating the plurality of substantially rectangular glass segments from one another at the attachment locations to provide a plurality of substantially rectangular glass cover members.

In one example of the first aspect, after claim (II), the method further comprises the step of finishing the edges of the glass segments.

In another example of the first aspect, after claim (II), the method further comprises the step of chemically strengthening the plurality of glass segments.

In still another example of the first aspect, step (II) separates the plurality of glass segments to provide the plurality of glass cover members with substantially the same shape.

In yet another example of the first aspect, step (II) separates the plurality of glass segments such that each glass segment has a non-even thickness from a first edge to a second edge of the glass segment.

In a further example of the first aspect, step (II) separates the plurality of glass segments such that each glass segment has a plano-convex cross section.

In still a further example of the first aspect, step (II) separates the plurality of glass segments such that each glass segment has a substantially constant thickness from a first edge to a second edge of the glass segment.

In another example of the first aspect, step (II) separates the plurality of glass segments such that each glass segment comprises a dish-shaped glass cover member.

In still another example of the first aspect, step (II) separates the plurality of glass segments such that each glass segment includes at least one upturned edge portion extending away from a central portion of the glass segment.

In yet another example of the first aspect, step (I) provides the glass tube by blow molding a glass parison within a mold cavity to form the glass tube.

In an example of the first aspect, the mold cavity is defined by at least two mold portions engaging one another along a separation seam aligned with at least one of the attachment locations of the glass tube.

In another example of the first aspect, the mold cavity is defined by an air bearing configured to inhibit contact of the outer surface of the glass parison with a surface defining the mold cavity.

In still another example of the first aspect, the attachment locations each include a thickness less than a thickness of the corresponding glass segments.

In yet another example of the first aspect, step (I) provides the glass tube with a polygonal configuration with the glass segments of the glass tube forming sides of the polygonal configuration.

In a further example of the first aspect, step (II) separates the plurality of glass segments from one another with a laser.

Any examples of the first aspect may be used alone or in combination with any number of the other examples of the first aspect discussed above.

In a second aspect of the disclosure, a method of making a substantially rectangular glass cover member includes the step (I) of providing a gob of molten glass. The method further includes the step (II) of pressing a form into the gob to provide a glass parison with an interior area surrounded by an outer wall having a predetermined parison wall configuration. The method further includes the step (III) of mounting the glass parison within a mold cavity of a mold device and the step (IV) of blow molding the glass parison to expand to follow an inner surface defining the mold cavity. The predetermined parison wall configuration expands to form a glass tube with a plurality of substantially rectangular glass segments including respective edges that are integrally attached to one another at attachment locations. The plurality of substantially rectangular glass segments are radially arranged about the axis of the glass tube to define an outer periphery of the glass tube. The method further includes the step (V) of separating the plurality of substantially rectangular glass segments from one another at the attachment locations to provide a plurality of substantially rectangular glass cover members.

In one example of the second aspect, after claim (V), the method further comprises the step of finishing the edges of the glass segments.

In another example of the second aspect, the inner surface defining the mold cavity is provided by an air bearing configured to inhibit contact of the outer surface of the glass parison with the inner surface during step (IV).

In a further example of the second aspect, the attachment locations include a thickness less than a thickness of the respective glass segments.

In still a further example of the second aspect, the method further includes the step of removing the glass tube from the mold device prior to step (V) of separating the plurality of glass segments from one another.

Any examples of the second aspect may be used alone or in combination with any number of the other examples of the second aspect discussed above.

In a third aspect, a glass tube comprises a plurality of substantially rectangular glass segments including respective edges that are integrally attached to one another at attachment locations. The plurality of substantially rectangular glass segments are radially arranged about an axis of the glass tube to define an outer periphery of the glass tube. The plurality of substantially rectangular glass segments each include a convex surface and a substantially flat surface defining a thickness of the glass segment between the convex surface and the flat surface. The thickness each glass segment varies between one of the attachment locations at a first side of the glass segment and another of the attachment locations at a second side of the glass segment. A thickness of the attachment locations at the corresponding first and second sides of each glass segment is less than the thickness of the corresponding glass segment.

In one example of the third aspect, the convex surface of each glass segment faces inwardly toward the axis of the glass tube and the flat surface of each glass segment faces outwardly away from the axis of the glass tube.

In another example of the third aspect, the convex surface of each glass segment faces outwardly away from the axis of the glass tube and the flat surface of each glass segment faces inwardly toward the axis of the glass tube.

Any examples of the third aspect may be used alone or in combination with any number of the other examples of the third aspect discussed above.

BRIEF DESCRIPTION OF THE DRAWINGS

These and other aspects are better understood when the following detailed description is read with reference to the accompanying drawings, in which.

DETAILED DESCRIPTION

Figure 1:
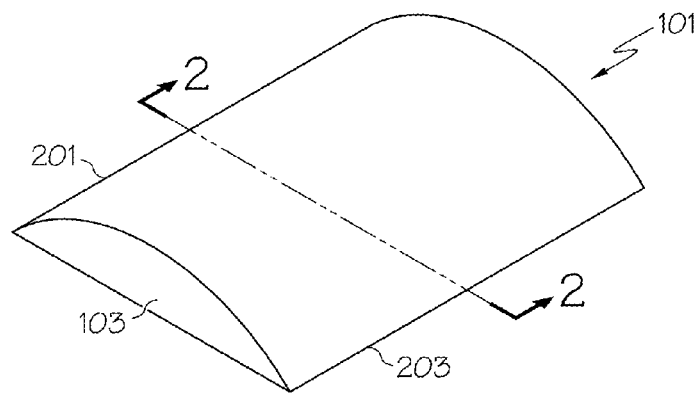
FIG. 1 is a perspective view of one example substantially rectangular glass cover member made in accordance with methods of the disclosure.

Examples will now be described more fully hereinafter with reference to the accompanying drawings in which example embodiments are shown. Whenever possible, the same reference numerals are used throughout the drawings to refer to the same or like parts. However, aspects may be embodied in many different forms and should not be construed as limited to the embodiments set forth herein.

FIGS. 1-11 illustrate features of just some examples of substantially rectangular glass cover members that can be created with aspects of the present disclosure. Glass cover members can be useful to be incorporated as part of a housing or a protective casing for a wide range of applications. In some applications, the glass cover members may be used for electronic devices although other applications may be provided in further examples. For instance, glass cover members may be incorporated as at least part of the housing for a hand-held device such as cell phones or other mobile devices (e.g., internet, audio, video, or other multimedia devices). As such, the cover members may be designed as part of the permanent housing for such devices. In further examples, the glass cover members may be provided as a protective casing for cell phones or other mobile devices. In such examples, the glass cover members may comprise a removable casing or shell for the devices.

Providing the substantially rectangular glass cover members in accordance with aspects of the present disclosure can help provide a hard, scratch resistant protective barrier to interior electrical components such as electronic display or other electronic components. At the same time, the substantially rectangular glass cover members can provide excellent optical qualities with a transparent barrier that allows transmission of light with minimal distortion. Still further, the substantially rectangular glass cover members may be chemically hardened, e.g., by ion-exchange, to eliminate scratches that may otherwise interfere with the optical qualities of the display of the device.

Methods of the disclosure may be particularly beneficial to help create substantially rectangular glass cover members with complex designs that are difficult and/or relatively expensive to create with alternative manufacturing techniques. In one example, methods of the disclosure can provide substantially rectangular glass segments that have a non-even thickness from a first edge to a second edge of the substantially rectangular glass segment. In some examples, one side of the substantially rectangular glass cover member may include a substantially planar surface. A substantially planar surface can allow contact of the planar surface with a substantially planar surface (e.g., display) of the mobile device. As such, light from the display can pass through the transition between the display and the glass cover member with little or no distortion. In further examples, the other side of the substantially rectangular glass cover member may include a substantially arcuate surface. A substantially arcuate surface can provide desired design features depending on the particular application.

Figure 2:
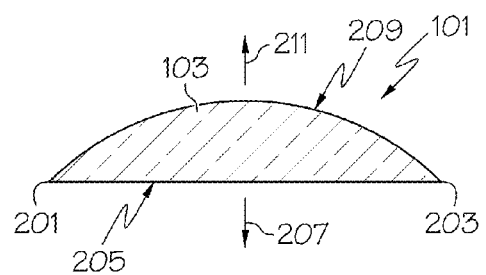
FIG. 2 is a cross-sectional view of the substantially rectangular glass cover member along line 2-2 of FIG. 1.

FIG. 1 illustrates just one substantially rectangular glass cover member 101 formed from a substantially rectangular glass segment 103. As shown in the cross-section of FIG. 2, the substantially rectangular glass segment 103 includes a non-even thickness from a first edge 201 to a second edge 203 of the substantially rectangular glass segment 103. For instance, as shown in FIG. 2, the substantially rectangular glass cover member 101 can be designed such that the substantially rectangular glass segment 103 includes a first side 205 facing a first direction 207 and a second side 209 facing a second direction 211 opposite the first direction 207. The first side 205 can be substantially planar while the second side 209 can comprise an arcuate surface although other surface shapes may be used in further examples. In the illustrated example shown in FIG. 2, the substantially rectangular glass segment 103 can include a plano-convex cross-section where the first side 205 comprises a substantially planar surface and the second side 209 comprises a substantially convex surface.

Figure 3:
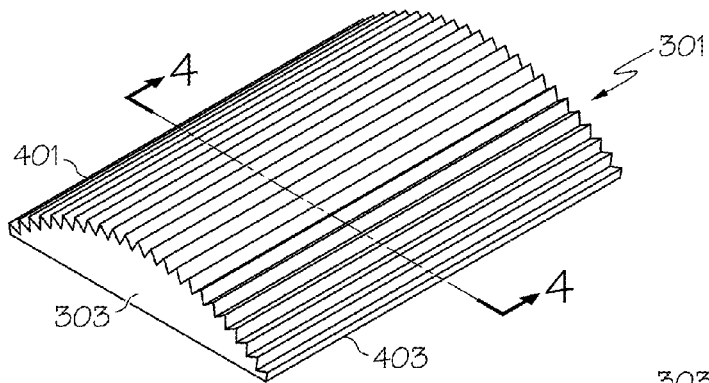
FIG. 3 is a perspective view of another example substantially rectangular glass cover member made in accordance with methods of the disclosure.
Figure 4:
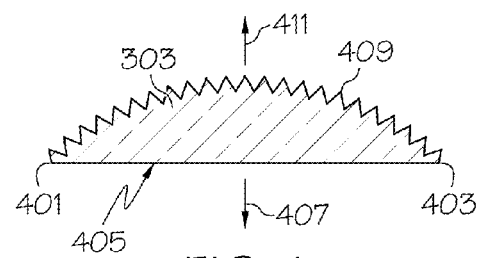
FIG. 4 is a cross-sectional view of the substantially rectangular glass cover member along line 4-4 of FIG. 3.

FIG. 3 illustrates another example substantially rectangular glass cover member 301 formed from a substantially rectangular glass segment 303. As shown in the cross-section of FIG. 4, the substantially rectangular glass segment 303 includes a non-even thickness from a first edge 401 to a second edge 403 of the substantially rectangular glass segment 303. For instance, as shown in FIG. 4, the substantially rectangular glass cover member 301 can be designed such that the substantially rectangular glass segment 303 includes a first side 405 facing a first direction 407 and a second side 409 facing a second direction 411 opposite the first direction 407. The first side 405 can be substantially planar while the second side 409 can comprise a splined configuration extending along an arcuate path.

In further examples, substantially rectangular glass segments may optionally include a substantially constant thickness from a first edge to a second edge of the substantially rectangular glass segment. Methods of the disclosure may be used to create substantially rectangular glass cover members having a substantially flat configuration with a substantially constant wall thickness. In further examples, methods of the disclosure may be used to provide substantially rectangular glass cover members from substantially rectangular glass segments including a substantially constant thickness from a first edge to a second edge of the glass segment with the glass segment including complex edge portions. For instance, the edge portions may be upturned with a relatively small radius. In addition or alternatively, the edge portions may include an outwardly bowed configuration and/or include other complex shapes. Edge portions that are upturned may wrap around an edge of a handheld device while the relatively small radius of curvature may allow the corner of the edge portion of the glass cover member to closely seat the corresponding corner (e.g., having a similar small radius of curvature) of the handheld device.

Figure 5:
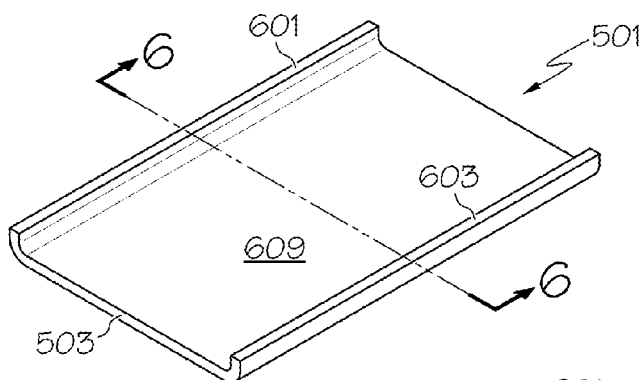
FIG. 5 is a perspective view of yet another example substantially rectangular glass cover member made in accordance with methods of the disclosure.

FIG. 5 illustrates one example substantially rectangular glass cover member 501 formed from a substantially rectangular glass segment 503. As shown in the cross-section of FIG. 6, the glass segment 503 includes a substantially constant thickness from a first edge 601 to a second edge 603 of the glass segment 503. Providing a substantially constant thickness can help minimize the glass used to form the glass cover member, reduce the weight of the glass cover member, and/or provide further design advantages over other glass cover designs having a varying thickness in certain applications. In such examples, the glass cover member 501 may optionally include a central portion 604 with a first substantially planar side 605 facing a first direction 607 and a second substantially planar side 609 facing a second direction 611 opposite the first direction 607.

Figure 6:
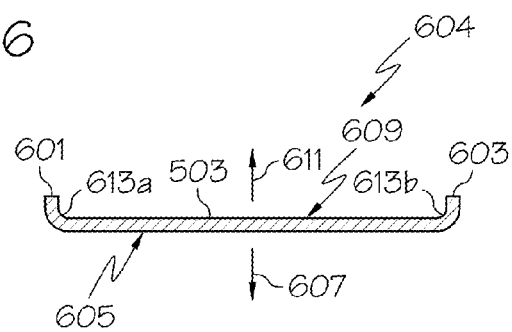
FIG. 6 is a cross-sectional view of the substantially rectangular glass cover member along line 6-6 of FIG. 5.

As further illustrated in FIGS. 5 and 6, glass segments made in accordance with aspects of the disclosure can include at least one upturned edge portion extending away from the central portion. For instance, the glass segment 503 of FIGS. 5 and 6 include two opposite edge portions 601, 603 that are both upturned to extend away from the central portion 604 of the glass segment 503. As illustrated, in some examples, the thickness of the upturned edge portions is substantially the same as the thickness of the central portion 604 of the glass segment 503. Moreover, methods of the disclosure can provide upturned edge portions with a relatively small radius of curvature. For example, each opposite edge portion 601, 603 can be upturned to extend away from the central portion 604 with a relatively small radius of curvature 613a, 613b.

Figure 7:
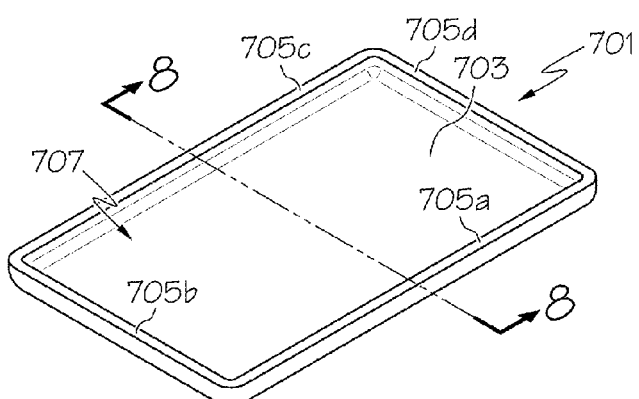
FIG. 7 is a perspective view of still another example substantially rectangular glass cover member made in accordance with methods of the disclosure.
Figure 8:
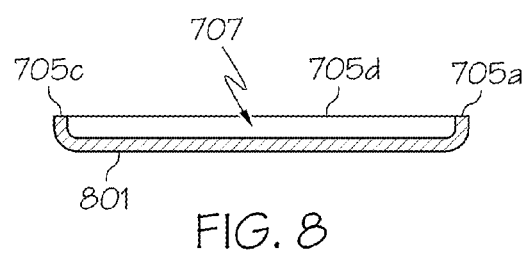
FIG. 8 is a cross-sectional view of the substantially rectangular glass cover member along line 8-8 of FIG. 7.

FIGS. 5 and 6 illustrate the glass segment including two upturned edge portions with the understanding that further examples may be provided with one or more than three upturned edge portions. For instance, a further example glass cover member may be fabricated with a glass segment similar to the glass segment 503 illustrated in FIG. 5 with a single upturned edge portion or three upturned edge portions. FIGS. 7 and 8 illustrate yet another substantially rectangular glass cover member 701 formed from a substantially rectangular glass segment 703 similar to the glass segment 503 of FIGS. 5 and 6, but having four upturned edge portions 705a-d. The four upturned edge portions 705a-d are connected to one another and a central portion 801 to form a dish-shaped glass cover member 701 including a cavity 707 configured to receive at least a portion of the handheld device.

Figure 9:
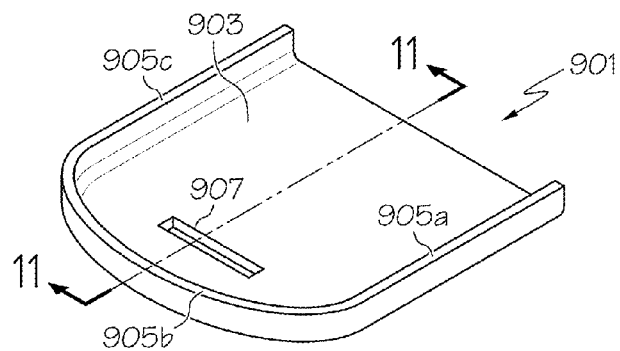
FIG. 9 is a perspective view of a further example substantially rectangular glass cover member made in accordance with methods of the disclosure.
Figure 10:
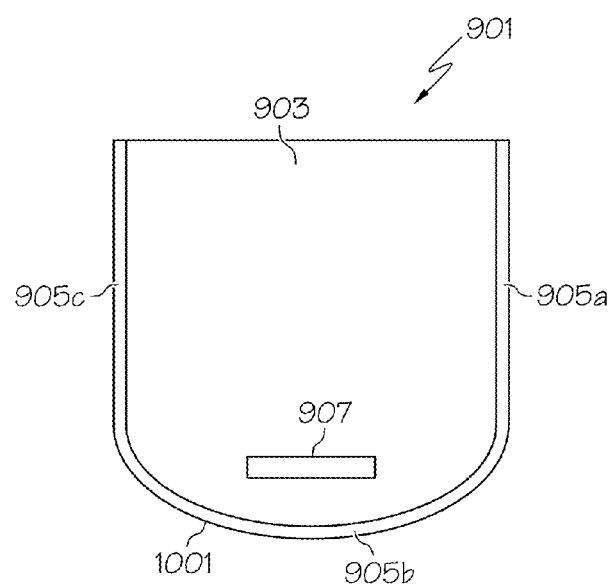
FIG. 10 is a top view of FIG. 9.
Figure 11:
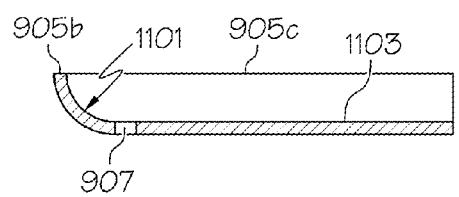
FIG. 11 is a cross-sectional view of the substantially rectangular glass cover member along line 11-11 of FIG. 9.
Figure 12:
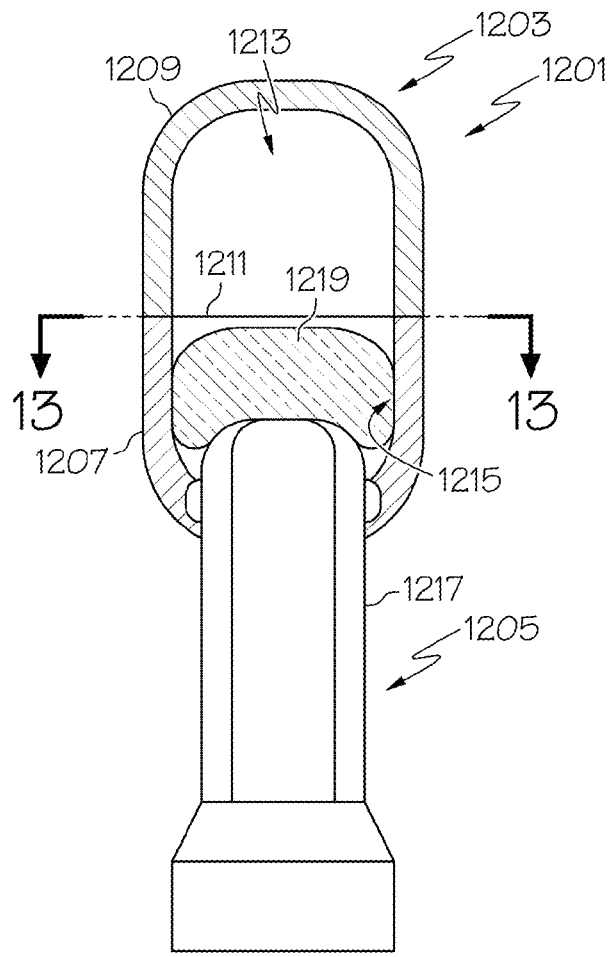
FIG. 12 is a cross-sectional view of a gob of molten glass positioned in a parison mold.

FIG. 9 illustrates a perspective view of a further example substantially rectangular glass cover member 901 that may be made in accordance with aspects of the present disclosure. As shown, the glass cover member 901 includes a substantially rectangular glass segment 903 with three upturned edge portions 905a-c. FIG. 10 shows a top view of the glass segment 903 wherein an end upturned edge portion 905b includes an outwardly bowed profile with an outwardly convex profile

1001. Moreover, as shown in the cross-section of FIG. 11, the end upturned edge portion 905*b* may have a gradual upturned radius 1101 from a central portion 1103. As with any of the glass cover members, subsequent machining or other processing techniques may provide one or more windows 907 to permit access to the handheld device through the glass cover member.

Illustrated and described above with reference to FIGS. 1-11, glass cover members 101, 301, 501, 701, and 901 are example cover members with a substantially rectangular shape to provide substantially rectangular glass cover members. For instance, the substantially rectangular glass cover members 101, 301 comprise a rectangular outer periphery wherein the first edge 201, 401 can be straight and parallel with respect to the respective second edge 203, 403 with substantially the same length. Moreover, as shown, end edges extending between the first and second edges can also likewise be straight and substantially parallel to one another with substantially the same length. As such, the substantially rectangular glass cover members 101, 301 can comprise four peripheral edges that form a rectangle, wherein, in some examples, the rectangle may optionally comprise a square. Moreover, a peripheral footprint projection from the outer periphery of the glass cover members 101, 301 can also comprise a substantially rectangular footprint as would be the case by projecting the footprint of the glass cover member 101 along directions 207, 211 and by projecting the footprint of the glass cover member 301 along directions 407, 411.

The glass cover member 501 also comprises a substantially rectangular glass cover member in that opposite edges 601, 603 can be substantially straight and parallel with respect to one another with substantially the same length. Likewise, the end edges extending between the opposite edges can also likewise be straight and substantially parallel to one another with substantially the same length. As such, the substantially rectangular glass cover member 501 can comprise four peripheral edges that form a rectangle, wherein, in some example, the rectangle may optionally comprise a square. Moreover, the peripheral footprint projection from the outer periphery of the glass cover member 501 can also comprise a substantially rectangular footprint as would be the case by projecting the footprint of the glass cover member 501 along directions 607, 611.

The glass cover member 701 also comprises a substantially rectangular glass cover member in that opposite side edges 705*a*, 705*c* can be substantially straight and parallel with respect to one another with substantially the same length. Likewise, the end edges 705*b*, 705*d* extending between the opposite side edges 705*a*, 705*c* can also likewise be straight and substantially parallel to one another with substantially the same length. As such, the substantially rectangular glass cover member 701 can comprise four peripheral edges that form a rectangle, wherein, in some example, the rectangle may optionally comprise a square. Moreover, the peripheral footprint projection from the outer periphery of the glass cover member 701 can also comprise a substantially rectangular footprint.

The glass cover member 901 also comprises a substantially rectangular glass cover member in that opposite side edges 905*a*, 905*c* can be substantially straight and parallel with respect to one another with substantially the same length. Likewise, one end edge is substantially straight while the other edge 905*b* includes a curved segment. Even though the edge 905*b* has a curved segment, the overall footprint, as shown in FIG. 10 is substantially rectangular, wherein the glass cover member 901 comprises a substantially rectangular glass cover member.

Various apparatus may be provided to manufacture glass cover members in accordance with aspects of the present disclosure. Various apparatus, for example, may provide a glass tube including a plurality of substantially rectangular glass segments including respective attachment edges that are integrally attached to one another at attachment locations, wherein the plurality of substantially rectangular glass segments are radially arranged about an axis of the glass tube to define an outer periphery of the glass tube. Glass tubes of the disclosure can comprise a glass tubular envelope including one or two open ends. As such, the glass tube may be provided as a glass tube with opposite open ends, wherein each end of the glass tube is open. In such examples, the glass tube with opposite open ends may be substantially defined, such as entirely defined, by the substantially rectangular glass segments and, if provided, the attachment locations between the substantially rectangular glass segments. As such, the first open end can be defined by first end edges of the substantially rectangular glass segments and the second open end can be defined by second end edges of the substantially rectangular glass segments. In further examples, one end may comprise a bottle opening that may be later separated to form one of the first or second end edges of the substantially rectangular glass segments.

In further examples, one end of the glass tube may be closed. For example, the glass tube may comprise a glass tube with a single open end. The open end may be defined by the ends of the substantially rectangular glass segments. In further examples, the open end may be defined by a bottle opening that may be later separated to form the first end edges of the substantially rectangular glass segments. The closed end may also be later separated to form the second end edges of the substantially rectangular glass segments.

Reference will not be made to an example apparatus to great the glass tube mentioned above with the understanding that other apparatus and/or techniques may be used to create similar tubes that may be subject to the methods to make substantially rectangular glass cover members in accordance with aspects of the disclosure. Moreover, as discussed below, the process of forming the glass tubes themselves may be considered aspects of example methods of making a substantially rectangular glass cover member.

FIGS. 12-20 illustrate examples of making glass tubes that may be further processed into the substantially rectangular glass cover members as discussed blow. With initial reference to FIGS. 12 and 13, the apparatus can include providing a parison forming device 1201 including a parison mold 1203 and a parison form 1205. The parison mold 1203 can include a first parison mold portion 1207 and a second parison mold portion 1209 that may be attached together along an interface 1211 to form an interior area 1213 defined by an interior surface 1215 of the parison mold 1203. The parison form 1205 includes a shaping member 1217 that may be used to form an interior area of the parison as discussed below.

Figure 13:
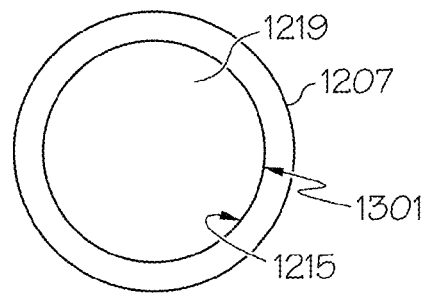
FIG. 13 is a cross-sectional view along line 13-13 of FIG. 12 illustrating the gob positioned within the parison mold.

Methods of making a glass parison can include introducing a gob 1219 of molten glass into the first parison mold portion 1207 with the parison form 1205 in a retracted position relative to the parison mold 1203. As shown in FIG. 13, the gob 1219 can flow such that an outer surface 1301 of the gob 1219 follows the interior surface 1215 of the parison mold 1203. The second parison mold portion 1209 is then mounted over the first parison mold portion 1207 and sealed at the interface 1211 to define the interior area 1213 of the parison mold 1203.

Figure 14:
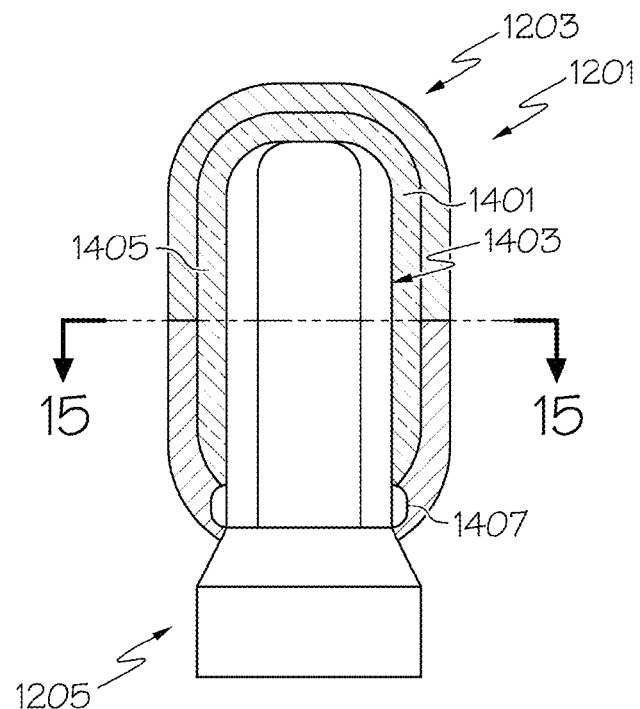
FIG. 14 is a cross-sectional view illustrating a form being pressed into the gob to provide a glass parison with an interior area surrounded by an outer wall.
Figure 15:
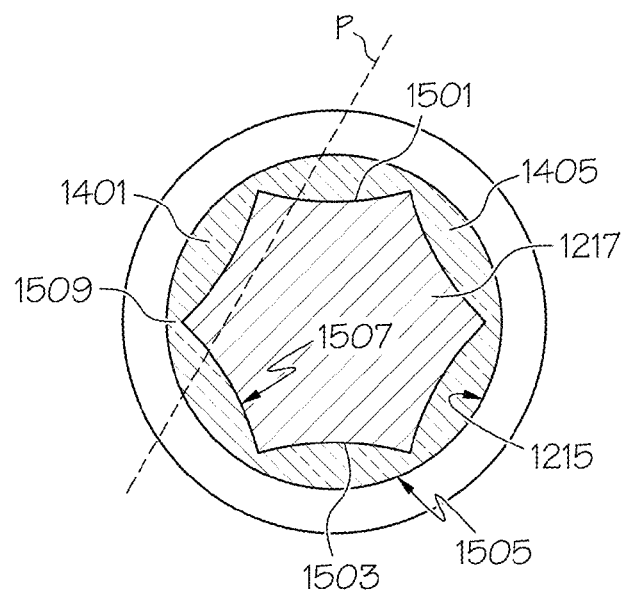
FIG. 15 is a cross-sectional view along line 15-15 of FIG. 14 illustrating a predetermined parison wall configuration provided by pressing the form into the gob.

As shown in FIG. 14, the method can then include the step of pressing the parison form 1205 to extended such that the shaping member 1217 enters into the interior area 1213 of the parison mold 1203 and into the gob 1219 to provide a glass parison 1401 with an interior area 1403 surrounded by an outer wall 1405 having a predetermined wall configuration. As shown in FIG. 15, an outer surface 1501 of the shaping member 1217 can be designed to closely follow the interior surface 1215 of the parison mold 1203 to provide a predetermined space that forms the outer wall 1405 of the glass parison 1401 when pressing the shaping member 1217 into the gob 1219 as shown in FIG. 14. As such, the glass parison 1401 may include a series of segments 1503 that may be identical to one another and radially arranged around the outer periphery of the outer wall 1405 of the glass parison 1401. Moreover, in some examples, each segment 1503 can include an outer arcuate surface 1505 that, as shown, may comprise an arc of a circle defined by all of the outer circumferential surfaces of the segments 1503. As further shown, each segment 1503 may also include an inner convex surface 1507, although planar surfaces extending parallel to a plane "P" may be provided in further examples. Still further, areas of reduced thickness are provided at locations 1509 between the segments 1503.

Figure 16:
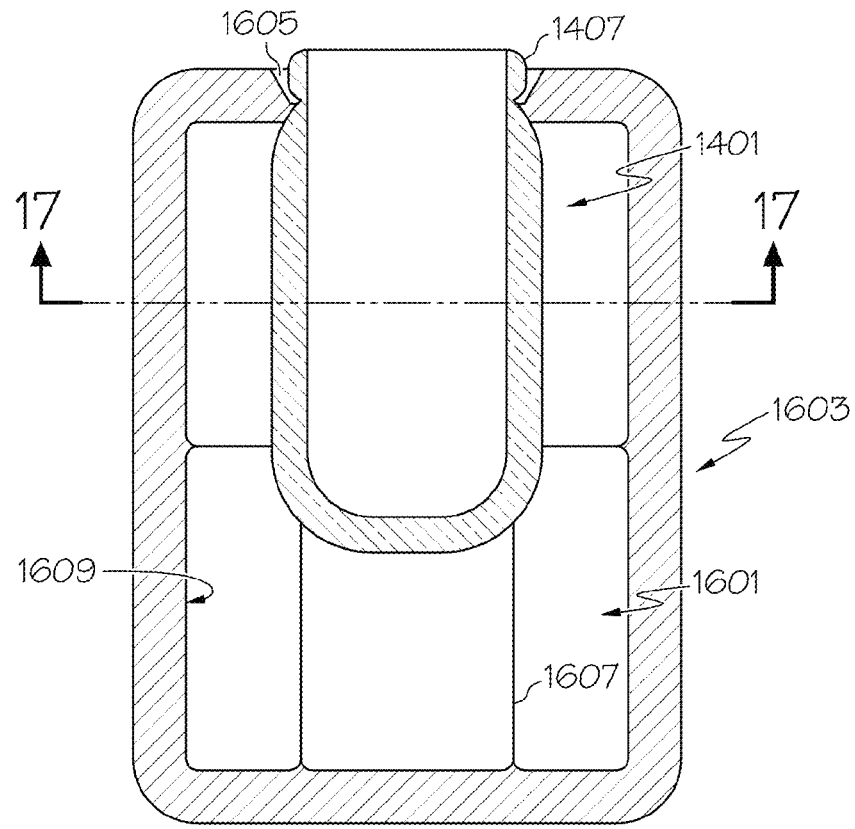
FIG. 16 is a cross-sectional view of the glass parison being mounted within a mold cavity of a mold device.
Figure 17:
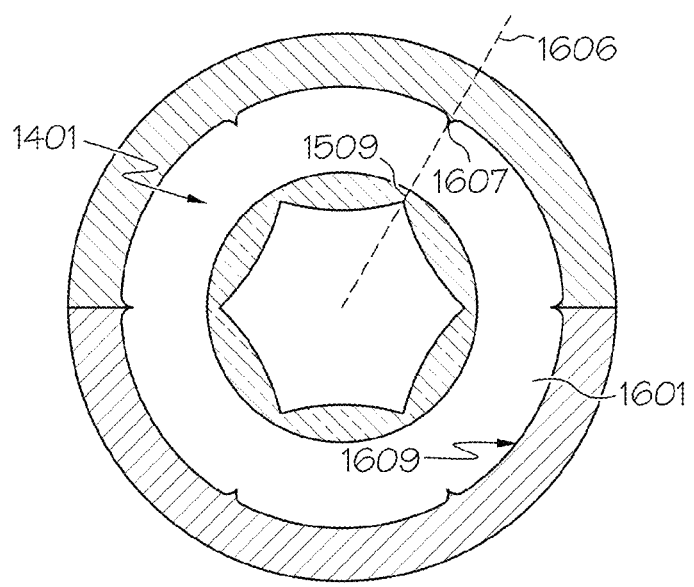
FIG. 17 is cross-sectional view of the glass parison and mold device along line 17-17 of FIG. 16.

As further illustrated in FIG. 14, the first parison mold portion 1207 can be configured to further provide the glass parison 1401 with a neck portion 1407. As shown in FIG. 16, the glass parison 1401 can then be mounted within a mold cavity 1601 of a mold device 1603. In one example, the neck portion 1407 of the glass parison 1401 may be keyed into an opening 1605 of the mold device 1603 such that the locations 1509 of the glass parison 1401 can be radially aligned along radial axis 1606 with optional ribs 1607 defined in an interior surface 1609 defining a mold cavity 1601 of the mold device 1603.

Figure 18:
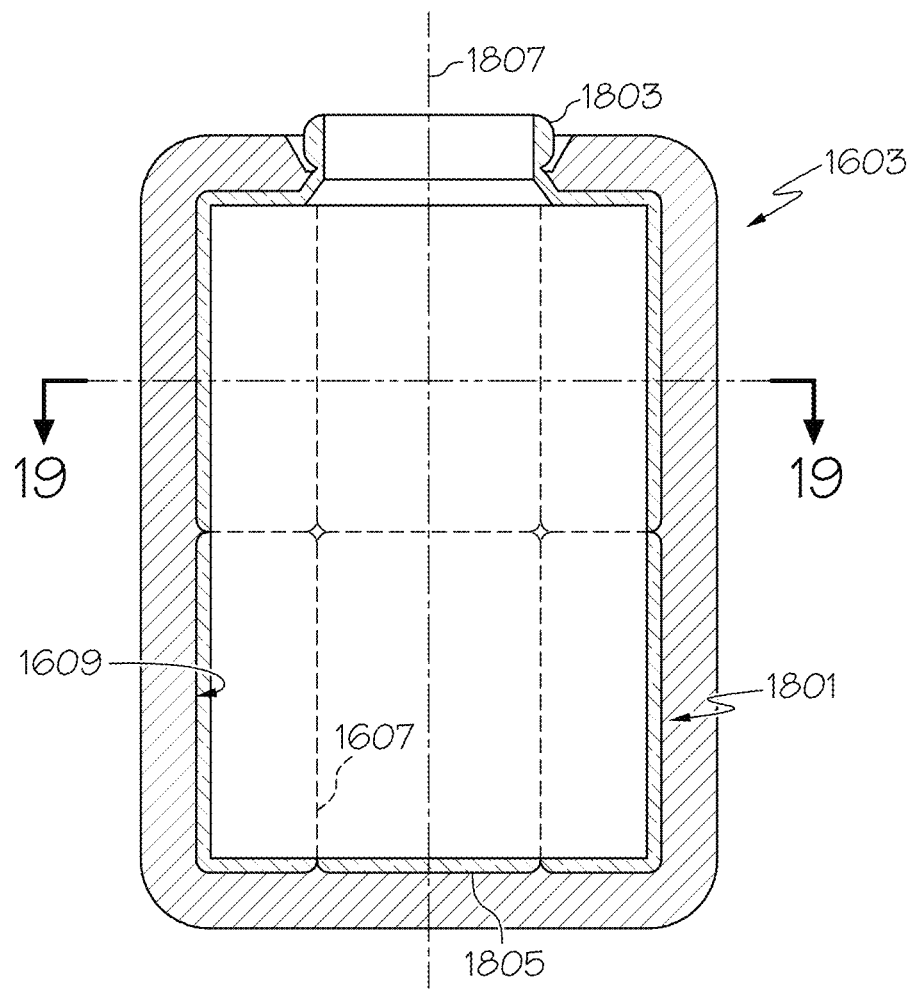
FIG. 18 a cross-sectional view of a glass tube being formed by blow molding the glass parison within the mold device.
Figure 19:
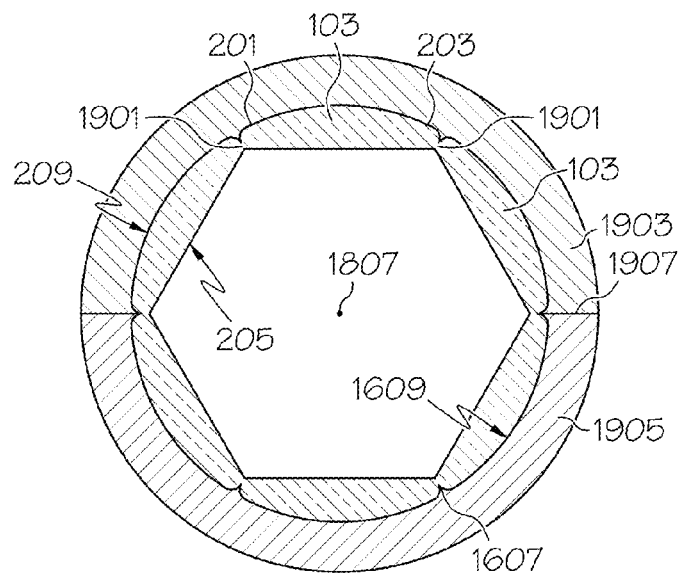
FIG. 19 is a cross-sectional view of the glass tube and mold device along line 19-19 of FIG. 18.

FIG. 18 illustrates step of providing a glass tube 1801 by blow molding the glass parison 1401 within the mold cavity 1601 to form the glass tube 1801. Indeed, the glass parison 1401 can be blow molded to expand to follow the inner surface 1609 defining the mold cavity 1601, wherein the predetermined parison wall configuration expands to form the glass tube 1801. The illustrated glass tube 1801 is shown to be part of a glass container, such as a glass jar although features of the disclosure may be performed with only the glass tube portion extending between an open upper end 1803 and a closed lower end 1805 of the glass container. As shown in FIG. 19, the glass tube 1801 can be provided with a plurality of substantially rectangular glass segments 103 including respective edges 201, 203 that are integrally attached to one another at attachment locations 1901. As further illustrated in FIG. 19, the plurality of substantially rectangular glass segments 103 are radially arranged about an axis 1807 of the glass tube 1801 to define an outer periphery of the glass tube 1801.

As discussed previously with respect to FIGS. 14 and 15, the method of pressing the gob 1219 provides the glass parison 1401 with the interior area 1403 surrounded by the outer wall 1405 having the predetermined wall configuration. The predetermined wall configuration of the glass parison 1401 carefully budgets the glass to provide the glass tube 1801 having substantially rectangular glass segments 103 having a desired shape after the process of blow molding shown in FIG. 18. Indeed, the inner convex surface 1507 of the parison segments 1503 can be configured to expand to define the planar first side 205 of the glass segment 103. Likewise, the outer arcuate surface 1505 of each parison segment 1503 can expand outward to define the convex second side 209 of the glass segment 103. Once formed, the mold device 1603 can be separated to remove the blown glass tube 1801. As shown in FIG. 19, the mold device 1603 can be defined by at least two mold portions 1903, 1905 engaged with one another along a separation seam 1907 aligned with at least one of the attachment locations 1901 of the glass tube 1801. Aligning the separation seam 1907 with the attachment locations 1901 can help preserve the surface quality of the first side 205 and the second side 209 of the glass segments 103. Indeed, to remove the glass tube from the mold device 1603, the mold portions 1903, 1905 can be separated from one another along the separation seam 1907 wherein any imperfections resulting from the seam will only be imposed on the attachment locations 1901, thereby preserving the surface quality of the first and second side 205, 209 of the glass segments 103.

Figure 20:
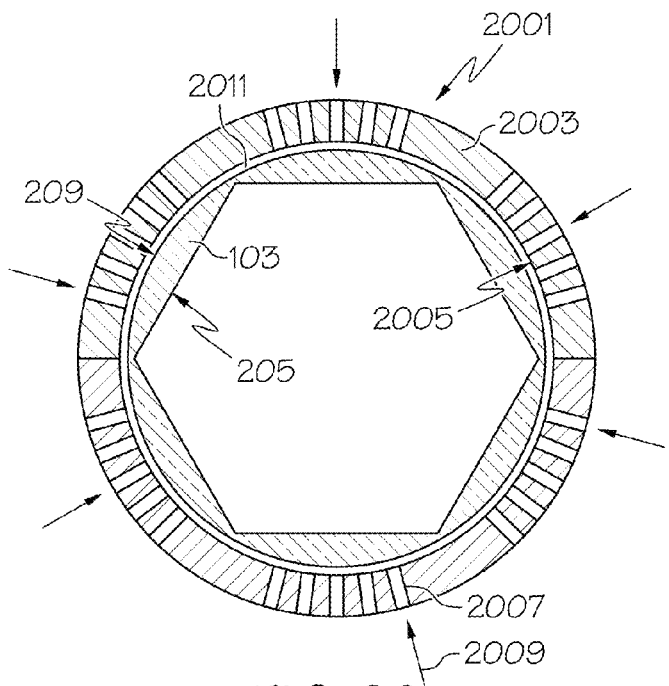
FIG. 20 is another cross-sectional view along line 19-19 of FIG. 18 illustrating an alternative embodiment of a mold device including an air bearing being used to form the glass tube.

FIG. 20 illustrates an alternative mold device 2001, wherein the mold cavity is defined by an air bearing 2003 configured to inhibit contact of the outer surface of the glass parison with a surface 2005 defining the mold cavity. The air bearing 2003 includes a plurality of air passages 2007 configured to pass an air stream 2009 from the surface 2005 defining the mold cavity. In some examples the air bearing can be metal coated with a porous ceramic layer or from graphite with a nitrogen bearing. In operation, when the parison is being blow molded into the glass tube, a space 2011 may be maintained between the outer surface of the blown glass tube and the inner surface 2005 defining the mold cavity. As such, both the first side 205 and the second side 209 of the substantially rectangular glass segments 103 can comprise substantially pristine surfaces that have little, if any, contact with mechanical components. As such, the substantially rectangular glass segments 103 can each be formed with first and second sides that are substantially free from defects that may otherwise be formed by contact with the mold apparatus when blow molding the glass parison into the glass tube.

Figure 21:
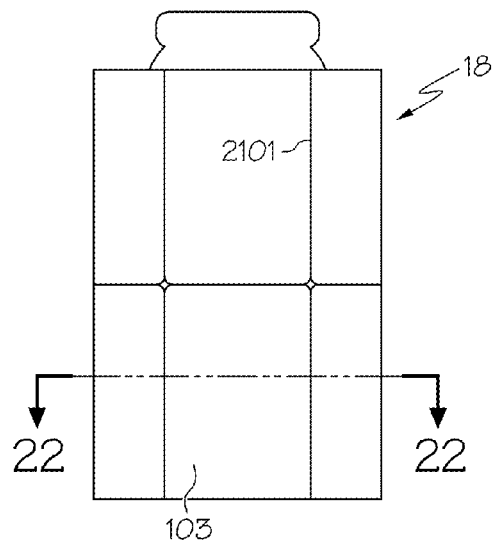
FIG. 21 is a front view of the glass tube of FIG. 18 after being removed from the mold device.
Figure 22:
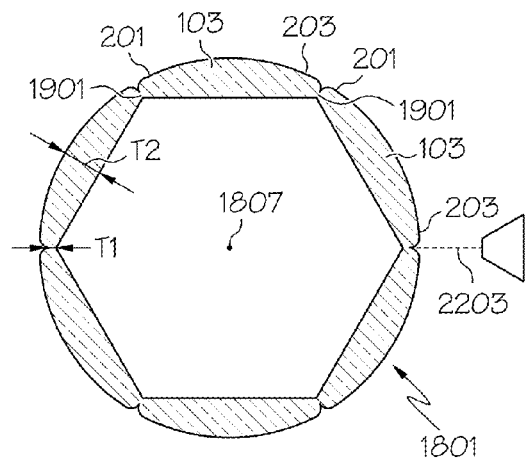
FIG. 22 is a cross-sectional view of the glass tube along line 22-22 of FIG. 21.

Methods of the present invention can therefore provide a glass tube, such as the glass tube 1801 shown in FIG. 21. The glass tube can be formed from a blow mold process (e.g., as discussed above) or by other methods in accordance with aspects of the present disclosure. As shown in FIG. 22, the glass tube 1801 can include the plurality of the substantially rectangular glass segments 103 illustrated in FIG. 1 although the glass tube may be formed with any of the other substantially rectangular glass segments 303, 503, 703, 903 although other configurations may be provided in further examples.

As shown in FIG. 22, the plurality of substantially rectangular glass segments 103 include respective edges 201, 203 that are integrally attached to one another at attachment locations 1901. The attachment locations 1901 each include a thickness T1 less than a thickness T2 of the corresponding glass segments 103 to provide a location of weakness to facilitate breaking away of the glass segments 103 from one another. As shown in FIG. 21, in some examples, the attachment locations 1901 can further be provided by elongated channels 2101 that may be formed by optional ribs 1607 (see FIGS. 16 and 19) of the mold device 1603. The elongated channels 2101 can help further reduce the thickness at the attachment locations 1901 to further simplify subsequent breaking away of the substantially rectangular glass segments 103 from one another.

As shown in FIG. 22, the substantially rectangular glass segments 103 are radially arranged about an axis 1807 of the glass tube 1801 to define an outer periphery of the glass tube 1801. As shown in FIG. 22, the glass tube 1801 includes a polygonal configuration with the substantially rectangular glass segments 103 of the glass tube 1801 forming sides of the polygonal configuration. As shown in FIG. 22, the polygonal configuration comprises a hexagon with six sides that each form on one of the glass segments 103. If provided as a polygonal configuration in further examples other configurations may be provided including two sides or other polygonal configurations having three or more sides.

As shown, in some examples, the glass segments 103 can be substantially identical to one another, thereby permitting a plurality of glass segments to be broken away from the glass tube 1801 to provide a plurality of glass cover members 101 with substantially the same shape.

Figure 23:
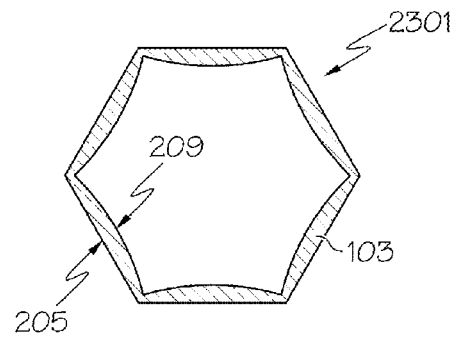
FIG. 23 is a cross-sectional view of an alternative glass tube that may be made in accordance with aspects of the disclosure.
Figure 24:
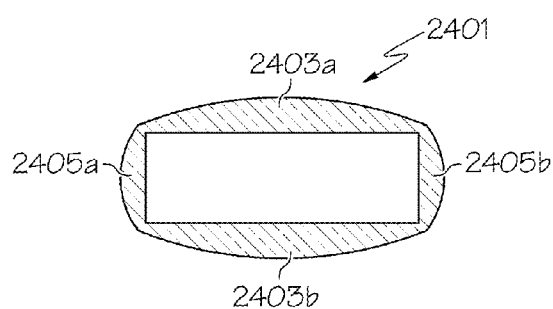
FIG. 24 is a cross-sectional view of another alternative glass tube that may be made in accordance with aspects of the disclosure.
Figure 25:
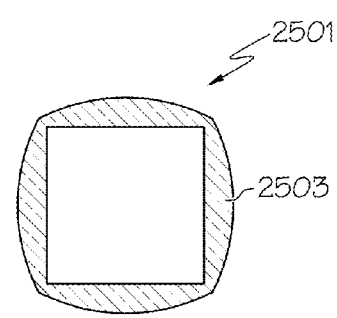
FIG. 25 is a cross-sectional view of still another alternative glass tube that may be made in accordance with aspects of the disclosure.

FIG. 23 shows an alternative example of a glass tube 2301 that may be formed to provide the substantially rectangular glass segments 103. As shown, the first flat side 205 may be formed by the outer surface while the second side 209 may be formed by the inner surface of the glass tube 2301. FIG. 24 illustrates an example glass tube 2401 including a rectangular configuration formed with a first pair of opposed identical substantially rectangular glass segments 2403a-b and a second pair of opposed identical substantially rectangular glass segments 2405a-b. FIG. 25 illustrates another example glass tube 2501 comprising a square configuration formed with four identical substantially rectangular glass segments 2503.

Each of FIGS. 21-25 illustrate various examples of a glass tube that includes a plurality of substantially rectangular glass segments including respective edges that are integrally attached to one another at attachment locations. The plurality of substantially rectangular glass segments can be radially arranged about an axis of the glass tube to define an outer periphery of the glass tube, and the plurality of substantially rectangular glass segments can each include a convex surface and a substantially flat surface defining a thickness of the glass segment between the convex surface and the flat surface. The thickness each glass segment varies between one of the attachment locations at a first side of the glass segment and another of the attachment locations at a second side of the glass segment. Moreover, a thickness of the attachment locations at the corresponding first and second sides of each glass segment can be less than the thickness of the corresponding glass segment. The reduced thickness of the attachment locations when compared to the thickness of the glass segment can help facilitate controlled breaking of the glass segments along the attachment locations, for example, by way of a laser 2201 discussed below.

FIGS. 22, 24 and 25 illustrate examples of the glass tube wherein the convex surface of each glass segment faces outwardly away from the axis of the glass tube and the flat surface of each glass segment faces inwardly toward the axis of the glass tube. FIG. 23 illustrates just one alternative examples where the convex surface of each glass segment faces inwardly toward the axis of the glass tube and the flat surface of each glass segment faces outwardly away from the axis of the glass tube.

Figure 26:
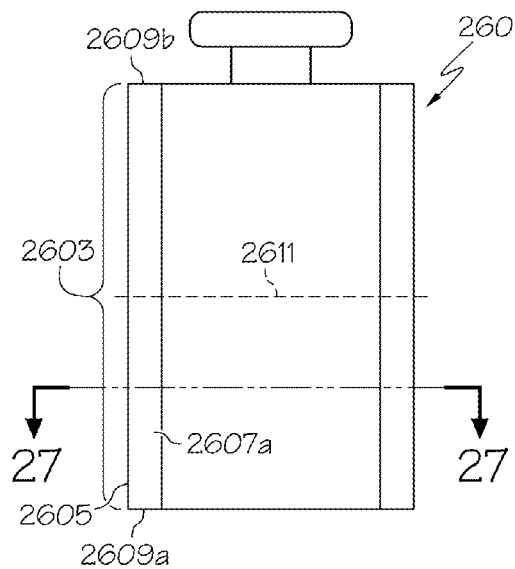
FIG. 26 is a front view of another glass tube that may be made in accordance with aspects of the disclosure.
Figure 28:
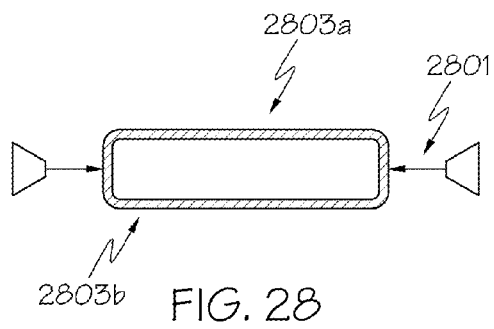
FIG. 28 is a cross-sectional view of an alternative glass tube that may be made in accordance with aspects of the disclosure.
Figure 27:
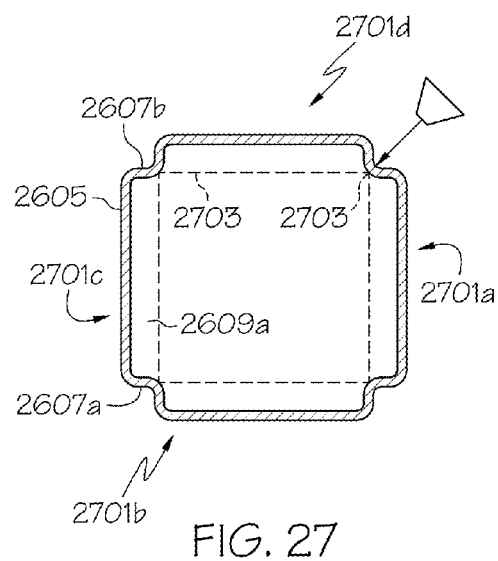
FIG. 27 is a cross-sectional view of the glass tube along line 27-27 of FIG. 26.

FIG. 26 illustrates just one further example of a glass tube 2601 that may provide various substantially rectangular glass segments with a substantially constant thickness from a first edge to a second edge of the glass segment and/or various substantially rectangular glass segments with at least one upturned edge portion extending away from a central portion of the glass segment. In some examples, the glass tube 2601 can provide a rectangular glass segment with all for edges comprising upturned edges to form a substantially dish-shaped glass cover member. Indeed, as shown in the cross-section of the glass tube 2601, four segments 2701a-d may be provided although, as shown in FIG. 28, the glass tube 2801 may include two glass segments 2803a, 2803b although any number of segments may be provided in further examples. As show in FIG. 26, a substantially rectangular glass segment may be formed as a dish 2603 including a central portion 2605 and a first pair of upturned edge portions 2607a, 2607b and second set of upturned edge portions 2609a, 2609b. The dish may be broken along attachment locations 2703 to form a substantially rectangular dish-shaped glass cover member 701 shown in FIG. 7. In further examples, the glass tube 2601 may be configured to be cut away to provide only two upturned edge portions similar to the glass segments 503 shown in FIG. 5. Alternatively, the glass tube may be optionally broken away along line 2611 to provide substantially rectangular glass segments with three sides, such as the glass segments 903 shown in FIG. 9. In such examples, the glass segments may be broken away from one another by imposing stress at the attachment locations between the glass segments. In some examples, the glass segments may be broken away from one another with a laser to impose stresses at the attachment locations sufficient to result in breaking of the glass segments from one another.

Figure 29:
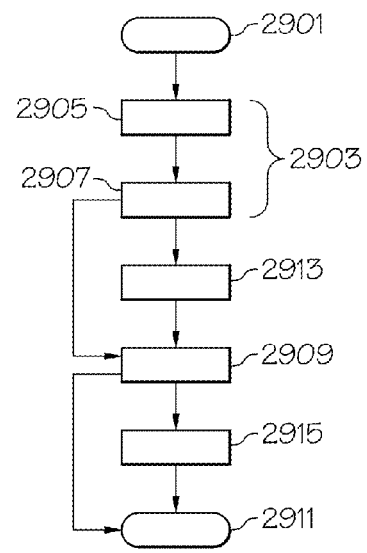
FIG. 29 is an example flow chart illustrating examples steps of making a glass cover member in accordance with aspects of the disclosure.

Methods of making a glass substantially rectangular cover member will now be described with reference to FIG. 29. The method will be discussed with respect to the substantially rectangular glass cover member 101 of FIG. 1 formed from the glass tube 1801 shown in FIG. 18 with the understanding that methods may be provided with other glass tubes to form identical or other substantially rectangular shaped glass cover members. As shown, the method may begin at 2901 with step 2903 of providing the glass tube 1801 including a plurality of substantially rectangular glass segments 103 including respective edges 201, 203 that are integrally attached to one another at attachment locations 1901. The plurality of glass segments 103 are radially arranged about the axis 1807 of the glass tube 1801 to define the outer periphery of the glass tube. The glass tube 1801 may be provided in a wide range of ways. For example, the method of making the glass tube can include the step 2905 of providing the gob 1219 of molten glass (see FIG. 13) and pressing the parison form 1205 into the gob 1219 to provide a glass parison 1401 with an interior area surrounded by an outer wall having a predetermined parison wall configuration. The method can then proceed to step 2907 of blow molding the glass parison 1401 to provide the glass tube 1801.

The method can then optionally directly proceed to step 2909 of separating the plurality of substantially rectangular glass segments 103 from one another at the attachment locations 1901 to provide a plurality of substantially rectangular glass cover members 101. As shown in FIG. 22, in one example, a laser 2201 can direct a laser beam 2203 to heat the attachment location 1901 to cause controlled breaking of the glass segments along the attachment locations. Providing the reduced thickness at the attachment locations can help desired break propagation along the attachment location 1901. Various lasers maybe used such as $CO_2$ lasers although other lasers may be used in further examples. The lasers can be applied while the glass tube cools from being blow molded. For example, the lasers can be applied to break the glass segments from the glass tube as the glass tube approaches the strain point. Alternatively, the laser may be applied after the glass tube is cooled, such as by a laser heating and cooling liquid quenching procedure. As such, the laser cutting can be operated at high temperature, when the glass product is still above its strain point. Alternatively separating can be carried out at room temperature in a fracture propagation mode with a laser with no local melting of the glass cut. In still further examples, mechanical breaking techniques may be used in further examples. As shown, separating the glass segments from the glass tube 1801 can be carried out after removing the glass tube 1801 from the mold device 1601 although the glass segments may be separated prior to being removed from the mold device 1601 in further examples.

Once the step 2909 of separating is finished, the glass segments may comprise the desired glass cover member 101 illustrated in FIG. 1 and the process may end at step 2911. In a further example, prior to the step 2909 of separating, the glass tube 1801 may be further processed during step 2913. For example, the glass tube 1801 may be annealed to provide the glass segments with a desired glass stress profile. The glass tube 1801 can be optionally turned to remove surface imperfections on the outer surface, polished, dispolishing/chemically etched or other treatment for anti-smudge or anti-glare purposes.

The further processing techniques described during step 2913 above may optionally be provided during step 2915 after the step 2909 of separating. Moreover, further finishing techniques may be provided to finish the edges 201, 203 of the glass segments. For example, the edges 201, 203 may be polished or otherwise finished to remove surface imperfections resulting from the step of separating. Furthermore, CNC machining techniques may be carried out to form windows (e.g., see window 907 in FIG. 9) or other features in the glass segment to form the complete glass cover member 101. Still further, once the glass segments are in final form, step 2915 may further include the step of chemically strengthening the glass segments to form strengthened glass cover members 101. In one example, chemically strengthening the glass segments may be provided by ion-exchange to provide strengthened glass, such as Gorilla® glass.

Either step 2913 and/or step 2915 may be designed to provide optical micro features such as micro lenses, for auto stereoscopic 3D functions for example. In further examples, glass texturing for finger print/anti-glare may also be provided. Alternatively, such features may be provided during the step 2907 of blow molding the glass parison 1401 to provide the glass tube 1801. In such examples, the interior surface 1609 defining a mold cavity 1601 of the mold device 1603 may be configured to impose the optical micro features and/or glass texturing mentioned above.

Methods of the present disclosure can provide glass cover members for a wide range of applications. For instance, methods of the disclosure can provide a plurality of glass cover members that may be identical to one another for various applications such as scratch resistant complex 3D shaped front and/or back covers for a cell phone or other mobile electronic device (e.g., mobile internet device). The methods herein can produce tight tolerances on deep 3D shapes such as dishes and can alternatively provide non-even thickness covers such as plan-convex sections.

Aspects of the disclosure can provide glass segments from a tube including a plurality of the glass segments. A glass parison can be formed with a predetermined wall profile that effectively budgets glass in order to obtain a desired profile of the glass tube during blow molding of the glass parison. As such, a glass tube can be formed with a plurality of 3D glass segments, such as 2-12 glass segments although more glass segments may be provided in further examples. Optional in-line processing techniques can also be carried out such as inline annealing and cutting that can be $CO_2$ laser operated. Optionally, 3D CNC machining can take place for more accurate contour dimension and potential local window openings or other modifications of the glass segment.

It will be apparent to those skilled in the art that various modifications and variations can be made without departing from the spirit and scope of the claimed invention.

What is claimed is:

1. A method of making a substantially rectangular glass cover member for an electronic device having a display portion, the method comprising the steps of:

(I) providing a glass tube by blow molding a glass parison within a mold cavity to form the glass tube, wherein the glass tube includes a plurality of substantially rectangular glass segments including respective edges that are integrally attached to one another at attachment locations and which have a substantially planar surface, and wherein the plurality of substantially rectangular glass segments are radially arranged about an axis of the glass tube to define an outer periphery of the glass tube; and (II) separating the plurality of substantially rectangular glass segments from one another at the attachment locations to provide a plurality of substantially rectangular glass cover members including the substantially planar surface which is disposed over the display portion of the electronic device wherein the mold cavity is defined by an air bearing configured to inhibit contact of the outer surface of the glass parison with a surface defining the mold cavity.

2. The method of claim 1, wherein, after step (II), further comprising the step of finishing the edges of the glass segments.

3. The method of claim 1, wherein, after step (II), further comprising the step of chemically strengthening the plurality of glass segments.

4. The method of claim 1, wherein step (II) separates the plurality of glass segments to provide the plurality of glass cover members with substantially the same shape.

5. The method of claim 1, wherein step (II) separates the plurality of glass segments such that each glass segment has a non-even thickness from a first edge to a second edge of the glass segment.

6. The method of claim 5, wherein step (II) separates the plurality of glass segments such that each glass segment has a plano-convex cross section.

7. The method of claim 1, wherein step (II) separates the plurality of glass segments such that each glass segment has a substantially constant thickness from a first edge to a second edge of the glass segment.

8. The method of claim 1, wherein step (II) separates the plurality of glass segments such that each glass segment comprises a dish-shaped glass cover member.

9. The method of claim 1, wherein step (II) separates the plurality of glass segments such that each glass segment includes at least one upturned edge portion extending away from a central portion of the glass segment.

10. The method of claim 1, wherein the mold cavity is defined by at least two mold portions engaging one another along a separation seam aligned with at least one of the attachment locations of the glass tube.

11. The method of claim 1, wherein the attachment locations each include a thickness less than a thickness of the corresponding glass segments.

12. The method of claim 1, wherein step (I) provides the glass tube with a polygonal configuration with the glass segments of the glass tube forming sides of the polygonal configuration.

13. The method of claim 1, wherein step (II) separates the plurality of glass segments from one another with a laser.

14. The method of claim 13 wherein the separation step is carried out employing in-line processing.

15. A method of making a substantially rectangular glass cover member for an electronic device having a display portion, the method comprising the steps of:

(I) providing a gob of molten glass;

(II) pressing a form into the gob to provide a glass parison with an interior area surrounded by an outer wall having a predetermined parison wall configuration;

(III) mounting the glass parison within a mold cavity of a mold device;

(IV) blow molding the glass parison to expand to follow an inner surface defining the mold cavity, wherein the predetermined parison wall configuration expands to form a glass tube with a plurality of substantially rectangular glass segments including respective edges that are integrally attached to one another at attachment locations, wherein the plurality of substantially rectangular glass segments are radially arranged about the axis of the glass tube to define an outer periphery of the glass tube; and (V) separating the plurality of substantially rectangular glass segments from one another at the attachment locations to provide a plurality of substantially rectangular glass cover members, each of which has a substantially planar surface which is disposed over the display portion of an electronic device wherein the inner surface defining the mold cavity is provided by an air bearing configured to inhibit contact of the outer surface of the glass parison with the inner surface during step (IV).

16. The method of claim 15, wherein, after step (V), further comprising the step of finishing the edges of the glass segments.

17. The method of claim 15, wherein the attachment locations include a thickness less than a thickness of the respective glass segments.

18. The method of claim 15, further including the step of removing the glass tube from the mold device prior to step (V) of separating the plurality of glass segments from one another.

19. The method of claim 15 wherein the separation step is carried out employing in-line processing using a laser.

* * * * *